United States Patent
Xu et al.

(10) Patent No.: US 11,194,988 B2
(45) Date of Patent: Dec. 7, 2021

(54) OPTICAL FINGERPRINT APPARATUS AND ELECTRONIC DEVICE

(71) Applicant: SHENZHEN GOODIX TECHNOLOGY CO., LTD., Shenzhen (CN)

(72) Inventors: Weitian Xu, Shenzhen (CN); Shengbin Zhang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/009,284

(22) Filed: Sep. 1, 2020

(65) Prior Publication Data

US 2021/0133420 A1 May 6, 2021

Related U.S. Application Data

(63) Continuation of application No. PCT/CN2019/115439, filed on Nov. 4, 2019.

(51) Int. Cl.
*G06K 9/00* (2006.01)

(52) U.S. Cl.
CPC .................. *G06K 9/0004* (2013.01)

(58) Field of Classification Search
CPC .................................... G06K 9/0004
See application file for complete search history.

(56) References Cited

U.S. PATENT DOCUMENTS 10,340,299 B2  7/2019 Shen et al.
2017/0161535 A1  6/2017 Lin et al.
(Continued)

FOREIGN PATENT DOCUMENTS

CN  107102693 A  8/2017
CN  207182346 U  4/2018
(Continued)

OTHER PUBLICATIONS

Zhou, B. et al., "Design and implementation of a fingerprint code lock and a digital electronic code lock", Journal of Hubei, Normal University (Natural Science), 2017, pp. 77-82, together with an English language abstract.
(Continued)

*Primary Examiner* — Joseph R Haley
(74) *Attorney, Agent, or Firm* — Scully Scott Murphy & Presser

(57) ABSTRACT

Provided are an optical fingerprint apparatus and an electronic device, applied to an electronic device having a display screen, where the optical fingerprint apparatus is configured to be disposed under the display screen, and the optical fingerprint apparatus includes: an optical fingerprint chip, where the optical fingerprint chip is configured to receive a fingerprint light signal returned from a finger above the display screen, and the fingerprint light signal is used to obtain a fingerprint image of the finger; and a light blocking layer formed on an upper surface of an edge region of the optical fingerprint chip, where the light blocking layer partially blocks the edge region of the optical fingerprint chip and does not block a sensing region of the optical fingerprint chip, and the light blocking layer is configured to block interference light entering the sensing region from the edge region of the optical fingerprint chip.

19 Claims, 5 Drawing Sheets

(56) References Cited

U.S. PATENT DOCUMENTS

2017/0220840 A1\* 8/2017 Wickboldt ........... G06K 9/0004
2019/0012512 A1 1/2019 He et al.
2019/0081097 A1 3/2019 Shen et al.
2019/0172875 A1\* 6/2019 Kang ....................... G06F 21/32
2019/0180072 A1 6/2019 Fomani et al.
2019/0326339 A1 10/2019 Dong et al.
2020/0285345 A1\* 9/2020 Xiang ................ G06K 9/00046

FOREIGN PATENT DOCUMENTS

| CN | 108090480 A | 5/2018 |
| CN | 108491761 A | 9/2018 |
| CN | 109074477 A | 12/2018 |
| CN | 109494201 A | 3/2019 |
| CN | 109690566 A | 4/2019 |
| CN | 109791610 A | 5/2019 |
| CN | 111133444 A | 5/2020 |
| CN | 210864756 U | 6/2020 |

OTHER PUBLICATIONS

Kim, S., et al., "An Adaptive Shuttering Scheme for Speed-Artifact-Free Swipe Fingerprint Sensor", IEEE, 2019, pp. 1-4.

\* cited by examiner

OPTICAL FINGERPRINT APPARATUS AND ELECTRONIC DEVICE

CROSS REFERENCE TO RELATED APPLICATIONS

The present application is a continuation of international application No. PCT/CN2019/115439, filed on Nov. 4, 2019, which is hereby incorporated by reference in its entirety.

TECHNICAL FIELD

Embodiments of the present application relate to the technical field of fingerprint identification, and more particularly, to an optical fingerprint apparatus and an electronic device.

BACKGROUND

With rapid development of a terminal industry, people pay more and more attention to fingerprint identification technology, and practical usage of under-screen fingerprint identification technology with more optimized performance has become a popular requirement.

A common under-screen fingerprint identification apparatus is a lens-based optical fingerprint apparatus. As shown in FIGS. 2 and 3, in order to ensure the performance of fingerprint identification, it is necessary to block or filter stray light that affects fingerprint imaging. In one implementation manner, a lens support can be disposed above a fingerprint sensor to block stray light that affects fingerprint identification. However, the lens support is large in volume and places higher space requirements for an electronic device. Therefore, how to filter the stray light to improve fingerprint identification performance becomes an urgent technical problem to be solved.

SUMMARY

Provided are an optical fingerprint apparatus and an electronic device, which may filter stray light and further improve fingerprint identification performance.

In a first aspect, provided is an optical fingerprint apparatus, applied to an electronic device having a display screen, where the optical fingerprint apparatus is configured to be disposed under the display screen, and the optical fingerprint apparatus includes:

an optical fingerprint chip including a sensing array having a plurality of optical sensing units, where the sensing array is configured to receive a fingerprint light signal returned from a finger above the display screen, and the fingerprint light signal is used to obtain a fingerprint image of the finger; and a light blocking layer formed on an upper surface of an edge region of the optical fingerprint chip, where the light blocking layer partially blocks the edge region of the optical fingerprint chip and does not block a sensing region of the optical fingerprint chip, and the light blocking layer is configured to block interference light entering the sensing array from the edge region of the optical fingerprint chip, where the sensing region is a region where the sensing array is located.

In some possible implementation manners, the light blocking layer is formed on the upper surface of the edge region of the optical fingerprint chip through a screen printing process or a spray coating process.

In some possible implementation manners, a distance between an inner side of the light blocking layer and an outer side of the sensing region of the optical fingerprint chip is greater than 200 microns.

In some possible implementation manners, a width of an overlapping portion of projection of the light blocking layer and the edge region of the optical fingerprint chip in a vertical direction is greater than or equal to 200 microns.

In some possible implementation manners, a thickness of the light blocking layer is less than or equal to 20 microns.

In some possible implementation manners, the optical fingerprint apparatus further includes:

a filter layer disposed on an upper surface of the optical fingerprint chip, where the filter layer covers at least the sensing region.

In some possible implementation manners, the light blocking layer coats an edge region of the filter layer.

In some possible implementation manners, the optical fingerprint apparatus further includes:

a circuit board disposed under the optical fingerprint chip, and electrically connected to the optical fingerprint chip through a gold wire, where the light blocking layer coats a region on the circuit board that is not covered by the optical fingerprint chip, and the gold wire.

In some possible implementation manners, between the display screen and the circuit board, a first foam structure and a second foam structure are provided at outer sides of the optical fingerprint chip, where the first foam structure is located above the second foam structure, and an upper surface of the second foam structure is not lower than an upper surface of the light blocking layer.

In some possible implementation manners, the upper surface of the second foam structure is not lower than an arc height of the gold wire.

In some possible implementation manners, a width of the first foam structure is greater than a width of the second foam structure so as to form a blocking portion at one end of the first foam structure close to the optical fingerprint chip, and the blocking portion partially blocks the edge region of the optical fingerprint chip and does not block the sensing region of the optical fingerprint chip.

In some possible implementation manners, the light blocking layer is oil ink.

In some possible implementation manners, the optical fingerprint apparatus further includes:

an optical component configured to direct the light signal returned from the finger above the display screen to the optical fingerprint chip for optical fingerprint detection.

In some possible implementation manners, the optical component includes: a micro-lens array formed by a plurality of micro-lenses and at least one light shielding layer, where the at least one light shielding layer is located under the micro-lens array, each light shielding layer is provided with a plurality of light passing holes, and the sensing array is configured to receive a light signal converged to the plurality of light passing holes via the micro-lens array and passing through the plurality of light passing holes.

In some possible implementation manners, a slot is provided in a middle frame of the electronic device, and the optical fingerprint apparatus is configured to be disposed in the slot.

In a second aspect, provided is an optical fingerprint apparatus, applied to an electronic device having a display screen, where the optical fingerprint apparatus is configured to be disposed under the display screen, and the optical fingerprint apparatus includes:

an optical fingerprint chip including a sensing array having a plurality of optical sensing units, where the sensing array is configured to receive a fingerprint light signal returned from a finger above the display screen, and the fingerprint light signal is used to obtain a fingerprint image of the finger; and a light blocking layer disposed above an edge region of the optical fingerprint chip, and fixed between a first foam structure and a second foam structure under the display screen, where the first foam structure and the second foam structure are located at outer sides of the edge region of the optical fingerprint chip, the first foam structure is located above the second foam structure, and an upper surface of the second foam structure is not lower than an upper surface of the optical fingerprint chip, where the light blocking layer partially blocks the edge region of the optical fingerprint chip and does not block a sensing region of the optical fingerprint chip, and the light blocking layer is configured to block interference light entering the sensing array from the edge region of the optical fingerprint chip, and the sensing region is a region where the sensing array is located.

In some possible implementation manners, a distance between an inner side of the light blocking layer and an outer side of the sensing region is greater than 200 microns.

In some possible implementation manners, a width of an overlapping portion of projection of the light blocking layer and the edge region of the optical fingerprint chip in a vertical direction is greater than or equal to 200 microns.

In some possible implementation manners, a thickness of the light blocking layer is between 20 microns and 50 microns.

In some possible implementation manners, the optical fingerprint apparatus further includes:

a filter layer disposed on the upper surface of the optical fingerprint chip, where the filter layer covers at least the sensing region of the optical fingerprint chip.

In some possible implementation manners, an upper surface of the filter layer is not higher than a lower surface of the light blocking layer, and the light blocking layer extends to an edge region of the filter layer.

In some possible implementation manners, an upper surface of the filter layer is flush with a lower surface of the light blocking layer, so as to form a sealed space between the filter layer, the light blocking layer, the optical fingerprint chip and the second foam structure.

In some possible implementation manners, the optical fingerprint apparatus further includes:

a circuit board disposed under the second foam structure and the optical fingerprint chip, and electrically connected to the optical fingerprint chip through a gold wire.

In some possible implementation manners, an arc height of the gold wire is lower than the upper surface of the second foam structure.

In some possible implementation manners, the optical fingerprint apparatus further includes:

an optical component configured to direct the light signal returned from the finger above the display screen to the optical fingerprint chip for optical fingerprint detection.

In some possible implementation manners, the optical component includes: a micro-lens array formed by a plurality of micro-lenses and at least one light shielding layer, where the at least one light shielding layer is located under the micro-lens array, each light shielding layer is provided with a plurality of light passing holes, and the sensing array is configured to receive a light signal converged to the plurality of light passing holes via the micro-lens array and passing through the plurality of light passing holes.

In some possible implementation manners, a slot is provided in a middle frame of the electronic device, and the optical fingerprint apparatus is disposed in the slot of the middle frame.

In a third aspect, provided is an electronic device, including:

a display screen; and the optical fingerprint apparatus in the first aspect or any possible implementation manner of the first aspect, where the optical fingerprint apparatus is disposed under the display screen.

In some possible implementation manners, the display screen is an organic light-emitting diode (OLED) display screen, and the display screen includes a plurality of OLED light sources, where the optical fingerprint apparatus employs at least a part of the OLED light sources as an excitation light source for optical fingerprint detection.

In a fourth aspect, provided is an electronic device, including:

a display screen; and the optical fingerprint apparatus in the second aspect or any possible implementation manner of the second aspect, where the optical fingerprint apparatus is disposed under the display screen.

In some possible implementation manners, the display screen is an organic light-emitting diode (OLED) display screen, and the display screen includes a plurality of OLED light sources, where the optical fingerprint apparatus employs at least a part of the OLED light sources as an excitation light source for optical fingerprint detection.

DESCRIPTION OF EMBODIMENTS

Technical solutions in embodiments of the present application will be described hereinafter with reference to accompanying drawings.

The technical solutions in the embodiments of the present application may be applied to various electronic devices.

For example, the various electronic devices include portable or mobile computing devices such as a smart phone, a notebook computer, a tablet computer and a game device, and other electronic devices such as an electronic database, an automobile and an automated teller machine (ATM), which is not limited in the embodiments of the present application.

The technical solutions in the embodiments of the present application may be applied to biometric identification technology. The biometric identification technology includes but is not limited to fingerprint identification, palmprint identification, iris identification, face identification, living body identification and other identification technologies. For convenience of illustration, description is made below by an example of a fingerprint identification technology.

The technical solutions in the embodiments of the present application may be applied to under-screen fingerprint identification technology. The under-screen fingerprint identification technology refers to mounting a fingerprint identification module under a display screen, thereby realizing a fingerprint identification operation in a display region of the display screen without setting a fingerprint capturing region in a region on the front of an electronic device other than the display region. Specifically, the fingerprint identification module uses light returned from a top surface of a display assembly of an electronic device for fingerprint sensing and other sensing operations. Such returned light carries information of an object (e.g., a finger) in contact with the top surface of the display assembly, and the fingerprint identification module under the display assembly implements under-screen fingerprint identification by capturing and detecting the returned light. The fingerprint identification module can be designed to achieve desired optical imaging by properly configuring optical elements for capturing and detecting the returned light.

Figure 1A:
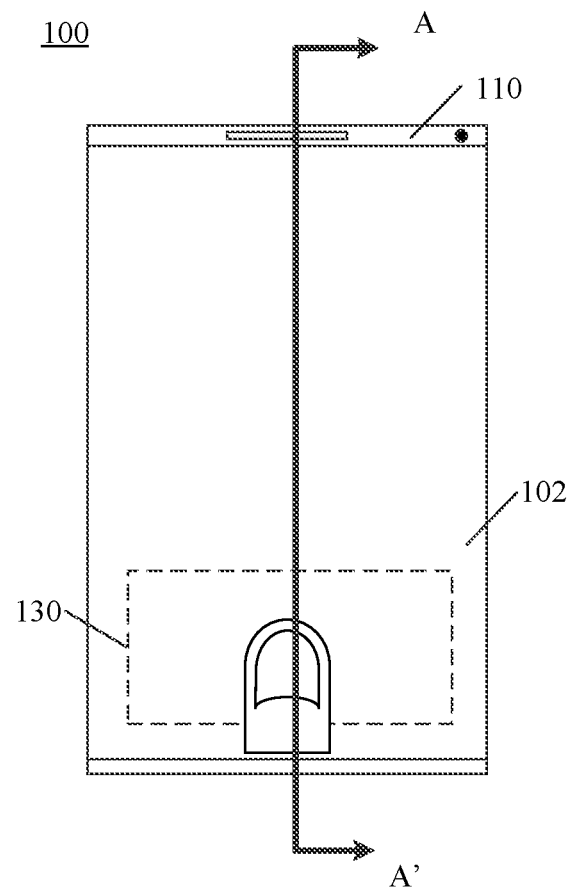
FIG. 1A is an oriented diagram of an electronic device according to an embodiment of the present application.
Figure 1B:
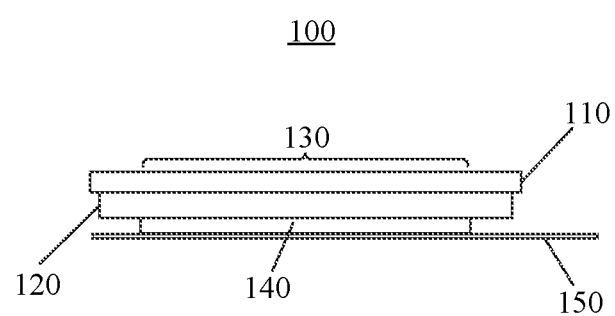
FIG. 1B is a schematic diagram of a partial cross-sectional structure of the electronic device shown in FIG. 1 taken along A-A'.

FIGS. 1A and 1B are schematic diagrams showing an electronic device 100 to which an under-screen fingerprint identification technology is applicable. FIG. 1A is schematic front view of an electronic device 100, and FIG. 1B is a schematic diagram of a partial cross-sectional structure of the electronic device 100 shown in FIG. 1A taken along A-A'.

As shown in FIGS. 1A and 1B, the electronic device 100 may include a display screen 120 and an optical fingerprint apparatus 140.

The display screen 120 may be a self-light-emitting display screen that employs a self-light-emitting display unit as a display pixel. For example, the display screen 120 may be an organic light-emitting diode (Organic Light-Emitting Diode, OLED) display screen or a micro light-emitting diode (Micro-LED) display screen. In other alternative embodiments, the display screen 120 may also be a liquid crystal display (Liquid Crystal Display, LCD) screen or other passive light-emitting display screens, which is not limited in the embodiments of the present application.

In addition, the display screen 120 may be specifically a touch display screen, which may not only display a screen but also detect a touch or press operation of a user, thereby providing the user with a human-machine interaction interface. For example, in an embodiment, the electronic device 100 may include a touch sensor, and the touch sensor may be specifically a touch panel (Touch Panel, TP), which may be disposed on a surface of the display screen 120, or may be partially integrated or entirely integrated into an interior of the display screen 120 to form the touch display screen.

Specifically, the optical fingerprint apparatus 140 may include a fingerprint sensor chip having an optical sensing array (hereinafter also referred to as an optical fingerprint sensor). The optical sensing array includes a plurality of optical sensing units, and each of the optical sensing units may specifically include a photodetector or a photoelectric sensor. In other words, the optical fingerprint apparatus 140 may include an array of photo detectors (or referred to as a photodetector array, a photosensor array, an optical sensor array, and a sensing array), which includes a plurality of photodetectors distributed in an array.

As shown in FIG. 1A, the optical fingerprint apparatus 140 may be disposed in a partial region under the display screen 120 such that a fingerprint capturing region (or a fingerprint detecting region) 130 of the optical fingerprint apparatus 140 is at least partially located in a display region 102 of the display screen 120.

Of course, in other alternative embodiments, the optical fingerprint apparatus 140 may also be disposed at other positions, such as a side of the display screen 120 or a non-light transmitting region of an edge of the electronic device 100. In this case, a light signal from at least part of the display region of the display screen 120 may be directed to the optical fingerprint apparatus 140 through a light path design, such that the fingerprint capturing region 130 is actually located in the display region of the display screen 120.

In some embodiments of the present application, the optical fingerprint apparatus 140 may only include one fingerprint sensor chip, and in this case, the fingerprint capturing region 130 of the optical fingerprint apparatus 140 has a smaller area and a fixed position, and therefore, the user needs to press the finger at a specific position of the fingerprint capturing region 130 when a fingerprint input is performed, otherwise the optical fingerprint apparatus 140 may not be able to capture a fingerprint image, thereby resulting in a poor user experience.

In other embodiments of the present application, the optical fingerprint apparatus 140 may specifically include a plurality of fingerprint sensor chips which may be disposed under the display screen 120 side by side in a splicing manner, and sensing regions of the plurality of fingerprint sensor chips collectively constitute the fingerprint capturing region 130 of the optical fingerprint apparatus 140. In other words, the fingerprint capturing region 130 of the optical fingerprint apparatus 140 may include a plurality of sub-regions, each sub-region corresponding to a sensing region of one of the fingerprint sensor chips respectively, so that the fingerprint capturing region 130 of the optical fingerprint module 140 may be extended to a main region of a lower portion of the display screen, that is, to a region generally pressed by the finger to achieve a blind pressing type of a fingerprint input operation. Alternatively, when the number of the fingerprint sensor chips is sufficient, the fingerprint detecting region 130 may also be extended to half of the display region or even the entire display region, thereby achieving half-screen or full-screen fingerprint detection.

It should be understood that the specific form of the plurality of fingerprint sensor chips is not limited in the embodiment of the present application. For example, the plurality of fingerprint sensor chips may be separately packaged fingerprint sensor chips, or may be multiple dies packaged in the same chip package. For another example, the plurality of fingerprint sensor chips may also be manufactured in different regions of the same die through a semiconductor process.

As shown in FIG. 1B, the region or optical sensing range of the optical sensing array of the optical fingerprint apparatus 140 corresponds to the fingerprint capturing region 130 of the optical fingerprint apparatus 140. The area of the fingerprint capturing region 130 of the optical fingerprint apparatus 140 may or may not be equal to the area of the region or the light sensing range of the optical sensing array of the optical fingerprint apparatus 140, which is not specifically limited in the embodiment of the present application.

For example, by means of a light path design of light collimation, the area of the fingerprint capturing region 130 of the optical fingerprint apparatus 140 may be designed to be substantially identical with the area of the sensing array of the optical fingerprint apparatus 140.

For another example, by means of a light path design of converging light or a light path design of reflecting light, the area of the fingerprint capturing region 130 of the optical fingerprint apparatus 140 may be made to be greater than the area of the sensing array of the optical fingerprint apparatus 140.

In some embodiments of the present application, the optical fingerprint apparatus 140 may further include an optical component, and the optical component may be disposed above the sensing array and may specifically include a filter (Filter) layer, a light directing layer or a light path directing structure, and other optical elements. The filter layer may be configured to filter ambient light passing through a finger, for example, infrared light interfering with imaging, and the light directing layer or the light path directing structure is mainly configured to direct reflected light reflected from a finger surface to the sensing array for optical detection.

The light path design of the optical fingerprint apparatus 140 will be exemplarily described below.

As an embodiment, the optical fingerprint apparatus 140 may adopt an optical collimator having an array of through holes with a high aspect ratio. The optical collimator may be specifically a collimator layer fabricated on a semiconductor silicon wafer, which has a plurality of collimating units or micro-pores, and the collimating unit may be specifically a hole. Among reflected light reflected from the finger, light that is vertically incident to the collimating unit may pass through the collimating unit and be received by the fingerprint sensor chip below it. However, light with an excessive large incident angle is attenuated through multiple reflection inside the collimating unit, and therefore, each fingerprint sensor chip may basically only receive the reflected light reflected from a fingerprint pattern right above the fingerprint sensor chip, thereby enhancing an image resolution effectively, and further improving a fingerprint identification effect.

Further, when the optical fingerprint apparatus 140 includes a plurality of fingerprint sensor chips, one collimating unit may be configured for one optical sensing unit in the optical sensing array of each fingerprint sensor chip, and attached above the corresponding optical sensing unit. Of course, the plurality of optical sensing units may also share one collimating unit, that is, the one collimating unit has a sufficiently large aperture to cover the plurality of optical sensing units. Since one collimating unit can correspond to a plurality of optical sensing units, correspondence between the spatial period of the display screen 120 and the spatial period of the fingerprint sensor chip is broken. Therefore, even if the spatial structure of the light-emitting display array of the display screen 120 is similar to the spatial structure of the optical sensing array of the fingerprint sensor chip, the optical fingerprint apparatus 140 can be effectively prevented from using a light signal passing through the display screen 120 to perform fingerprint imaging to generate moiré fringes, which effectively improves a fingerprint identification effect of the optical fingerprint apparatus 140.

As another embodiment, the optical fingerprint apparatus 140 may adopt a light path design based on an optical lens, and the optical lens may include an optical lens (Lens) layer having one or more lens units, for example, a lens group composed of one or more aspheric lenses, for converging reflected light reflected from the finger to the sensing array of the fingerprint sensor chip below it, so that the sensing array may perform imaging based on the reflected light so as to obtain the fingerprint image of the finger. The optical lens layer may further be provided with pinholes in the light path of the lens units, and the pinholes may cooperate with the optical lens layer to expand the field of view of the optical fingerprint apparatus 140, so as to improve a fingerprint imaging effect of the optical fingerprint apparatus 140.

Further, when the optical fingerprint apparatus 140 includes a plurality of fingerprint sensor chips, each fingerprint sensor chip may be configured with one optical lens for fingerprint imaging, or the plurality of fingerprint sensor chips may be configured with one optical lens to achieve light convergence and fingerprint imaging. Even when one fingerprint sensor chip has dual arrays or multiple sensing arrays (Multi-Arrays), two or more optical lenses may also be configured for the fingerprint sensor chip to cooperate with the dual arrays or multi-arrays for optical imaging so as to reduce an imaging distance and enhance an imaging effect.

As yet another embodiment, the optical fingerprint apparatus 140 may adopt a light path design of a micro-lens layer, and the micro-lens layer may have a micro-lens array formed by a plurality of micro-lenses, which may be formed above the sensing array of the fingerprint sensor chip through a semiconductor growth process or other processes, and each micro-lens may correspond to one of the sensing units in the sensing array respectively. Other optical film layers such as a dielectric layer or a passivation layer may be formed between the micro-lens layer and the sensing unit, and more specifically, a light shielding layer having micro-pores may further be included between the micro-lens layer and the sensing unit, where the micro-pores are formed between corresponding micro-lenses and sensing units, and the light shielding layer may shield optical interference between adjacent micro-lenses and sensing units, such that light is converged to the interior of the micro-pore through the micro-lens and transmitted to the sensing unit corresponding to the micro-lens via the micro-pore to perform optical fingerprint imaging.

It should be understood that several implementations of the forgoing light path directing structure may be used alone or in combination, for example, a micro-lens layer may be further disposed under the collimator layer or the optical lens layer. Certainly, when the collimator layer or the optical lens layer is used in combination with the micro-lens layer, the specific laminated structure or light path may require to be adjusted according to actual needs.

The optical fingerprint apparatus 140 may be configured to capture fingerprint information (such as fingerprint image information) of a user.

As an optional embodiment, the display screen 120 may adopt a display screen having a self-light-emitting display unit, for example, an organic light-emitting diode (OLED) display screen or a micro light-emitting diode (Micro-LED) display screen. As an example, when an OLED display screen is adopted, the optical fingerprint apparatus 140 may use a display unit (that is, an OLED light source) of the OLED display screen that is located at the fingerprint capturing region 130 as an excitation light source for optical fingerprint detection.

When a finger touches, is pressed against, or approaches (collectively referred to as pressing in the present application for convenience of description) the fingerprint capturing region 130, the display screen 120 emits a beam of light to the finger above the fingerprint capturing region 130, and the beam of light is reflected on a surface of the finger to form reflected light or scattered inside the finger to form scattered light. In related patent applications, the above reflected light and scattered light are collectively referred to as reflected light for convenience of description. Since a ridge and a valley of a fingerprint have different light reflecting capabilities, reflected light from the ridge of the fingerprint and reflected light from the valley of the fingerprint have different light intensities. After passing through the display screen 120, the reflected light is received by the fingerprint sensor chip in the optical fingerprint apparatus 140 and converted into a corresponding electrical signal, that is, a fingerprint detecting signal; and fingerprint image data may be obtained based on the fingerprint detecting signal, and fingerprint matching verification may be further performed, thereby implementing an optical fingerprint identification function at the electronic device 100.

Thus it can be seen that when a user needs to unlock the electronic device 100 by a fingerprint or perform other fingerprint verification, a fingerprint feature input operation can be implemented merely by pressing a finger on the fingerprint capturing region 130 on the display screen 120. Since capturing of a fingerprint feature can be implemented inside the display region 102 of the display screen 120, a front surface of the electronic device 100 in the above structure does not need to specially reserve space to set a fingerprint button (such as a Home button), and a full screen solution can be adopted. Therefore, the display region 102 of the display screen 120 can be substantially extended to the entire front surface of the electronic device 100.

In other alternative embodiments, the optical fingerprint apparatus 140 may also use an internal light source or an external light source to provide a light signal for fingerprint detection and identification. In this case, the optical fingerprint apparatus 140 can be applied not only to a self-light-emitting display screen such as an OLED display screen, but also to a non-self-light-emitting display screen such as a liquid crystal display screen or other passive light-emitting display screens.

As an example, when applied to a liquid crystal display screen having a backlight module and a liquid crystal panel, an optical fingerprint system of the electronic device 100 may further include an excitation light source for optical fingerprint detection in order to support under-display fingerprint detection of the liquid crystal display screen. The excitation light source may specifically be an infrared light source or a light source of non-visible light in a specific wavelength, which may be disposed under the backlight module of the liquid crystal display screen or disposed in an edge region under a protective cover of the electronic device 100. The optical fingerprint apparatus 140 may be disposed under the liquid crystal panel or the edge region of the protective cover, and light for fingerprint detection may reach the optical fingerprint apparatus 140 through directing by a light path. Alternatively, the optical fingerprint apparatus 140 may also be disposed under the backlight module, and the backlight module allows the light for fingerprint detection to pass through the liquid crystal panel and the backlight module and reach the optical fingerprint apparatus 140 by providing a hole on film layers such as a diffusion sheet, a brightening sheet, a reflection sheet or the like, or by performing other optical designs. When the optical fingerprint apparatus 140 uses an internal light source or an external light source to provide a light signal for fingerprint detection, a detection principle may be the same.

As shown in FIG. 1A, the electronic device 100 may further include a transparent protective cover 110 such as a glass cover or a sapphire cover which is located on the display screen 120 and covers a front surface of the electronic device 100, and the surface of the cover 110 may also be provided with a protective layer. Therefore, in the embodiment of the present application, the so-called finger being pressed against the display screen 120 may actually refer to the finger being pressed against the cover 110 on the display screen 120 or a surface of the protective layer covering the cover 110.

As shown in FIG. 1B, a circuit board 150, such as a flexible printed circuit (FPC), may also be disposed under the optical fingerprint apparatus 140.

The optical fingerprint apparatus 140 may be soldered to the circuit board 150 through a pad. Specifically, the fingerprint sensor chip in the optical fingerprint apparatus 140 may be connected to the circuit board 150 through a pad, and achieves electrical interconnection and signal transmission with other peripheral circuits or other elements of the electronic device 100 through the circuit board 150. For example, the optical fingerprint apparatus 140 may receive a control signal of a processing unit of the electronic device 100 through the circuit board 150, and may also output a fingerprint detecting signal from the optical fingerprint apparatus 140 to the processing unit, a control unit, or the like of the electronic device 100 through the circuit board 150.

In some embodiments, it may also be considered that the optical fingerprint apparatus 140 includes the circuit board 150.

Figure 2:
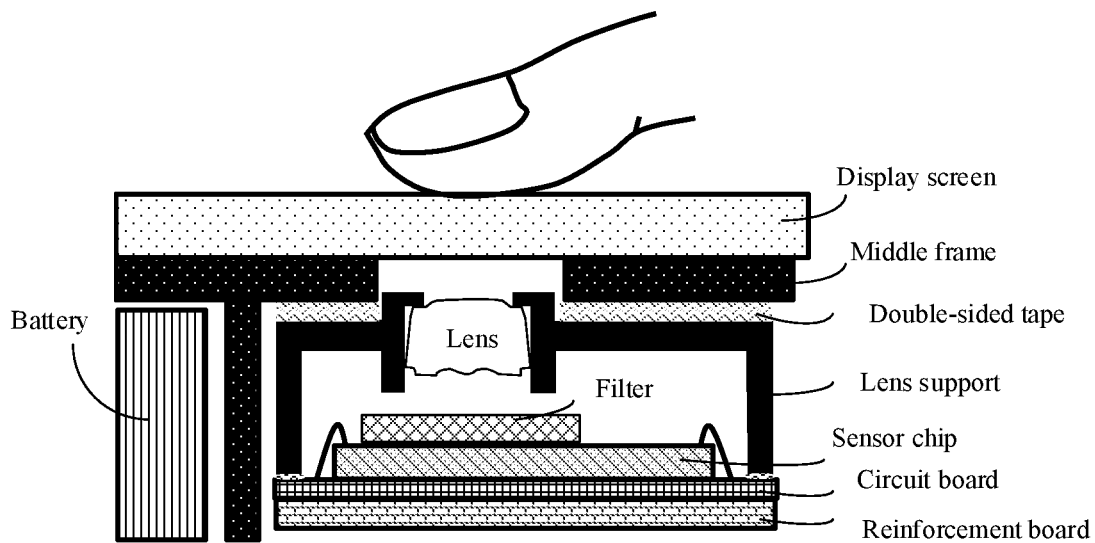
FIG. 2 is a schematic diagram of a typical structure of an optical fingerprint apparatus.
Figure 3:
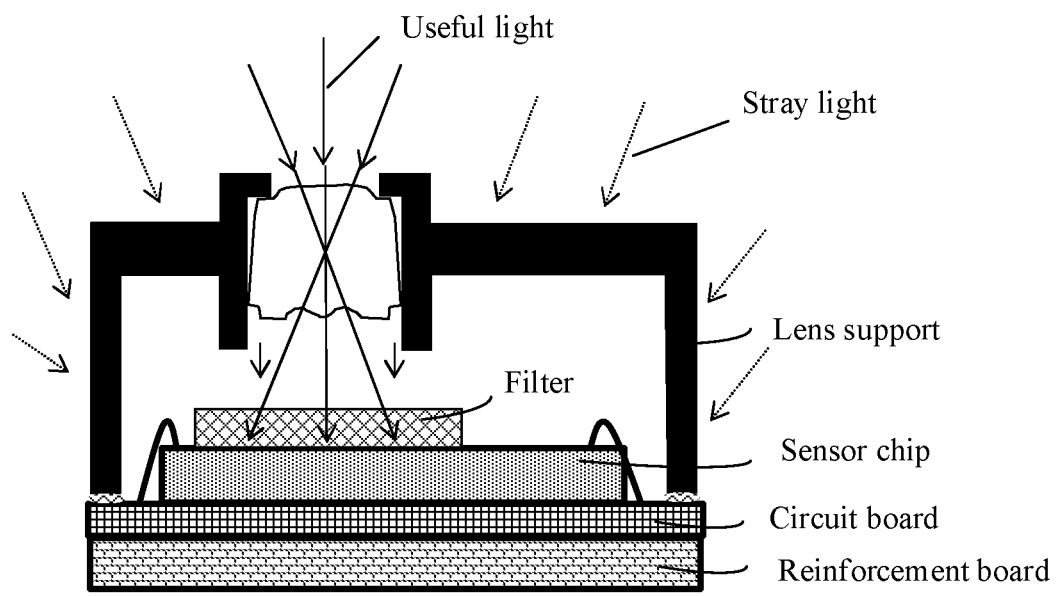
FIG. 3 is a working principle diagram of the optical fingerprint apparatus shown in FIG. 2.

In the embodiments of the present application, a filter may be provided above the sensing array of the fingerprint sensor chip to filter out stray light that affects fingerprint imaging. In some embodiments, for an optical fingerprint apparatus implemented by an optical lens, a lens support may also be provided above the optical fingerprint apparatus to filter out stray light that affects fingerprint imaging, and reference can be made to FIGS. 2 and 3, so as to ensure that light signals entering the sensing array are all useful light signals containing fingerprint information. However, the lens support is larger in volume, and cannot meet the demand of an electronic device for higher size requirements.

In view of this, an embodiment of the present application provides a technical solution, which can provide a light blocking layer above an edge region of a fingerprint sensor chip, so as to block stray light entering a sensing array from the edge region of the fingerprint sensor chip, thereby improving fingerprint identification performance.

It should be noted that for convenience of description, in the embodiments of the present application, like reference numerals represent like components, and detailed description of the like components is omitted in different embodiments for brevity. It should be understood that dimensions such as thicknesses, lengths and widths of various components, as well as dimensions of the overall thickness, length and width of an integrated apparatus in embodiments of the present application shown in the drawings are merely illustrative, and should not constitute any limitation to the present application.

Hereinafter, an optical fingerprint apparatus 30 according to an embodiment of the present application will be described in detail with reference to FIGS. 4 to 9. The optical fingerprint apparatus 30 is configured to be disposed under a display screen of an electronic device.

Figure 9:
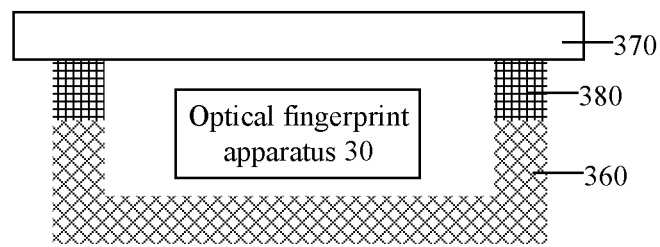
FIG. 9 is a schematic diagram of a mounting position of an optical fingerprint apparatus in an electronic device according to an embodiment of the present application.

In some embodiments of the present application, as shown in FIG. 9, a slot is provided in a middle frame 360 of an electronic device, and the optical fingerprint apparatus 30 may be configured to be disposed in the slot of the middle frame 360, and the middle frame 360 can be connected under a display screen 370 of the electronic device through foam 380 to implement under-screen optical fingerprint detection.

It should be understood that in the embodiment of the present application, the display screen 370 may be the display screen 120 as shown in FIG. 1B. For related description, reference may be made to the foregoing description about the display screen 120, and details are not described herein again for brevity.

Figure 4:
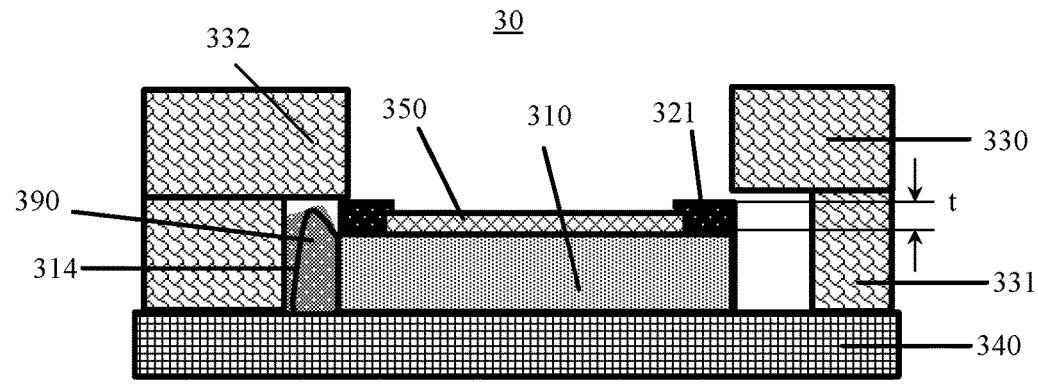
FIG. 4 is a schematic structural diagram of an optical fingerprint apparatus according to an embodiment of the present application.
Figure 6:
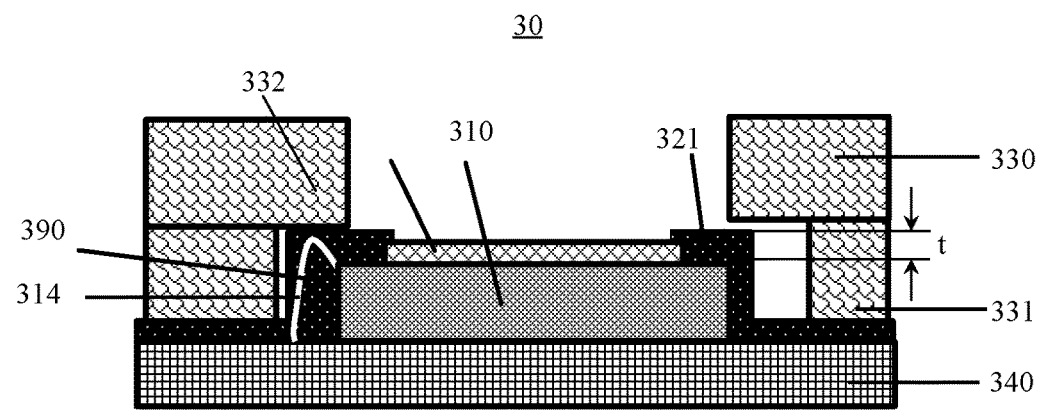
FIG. 6 is a schematic structural diagram of an optical fingerprint apparatus according to an embodiment of the present application.
Figure 10:
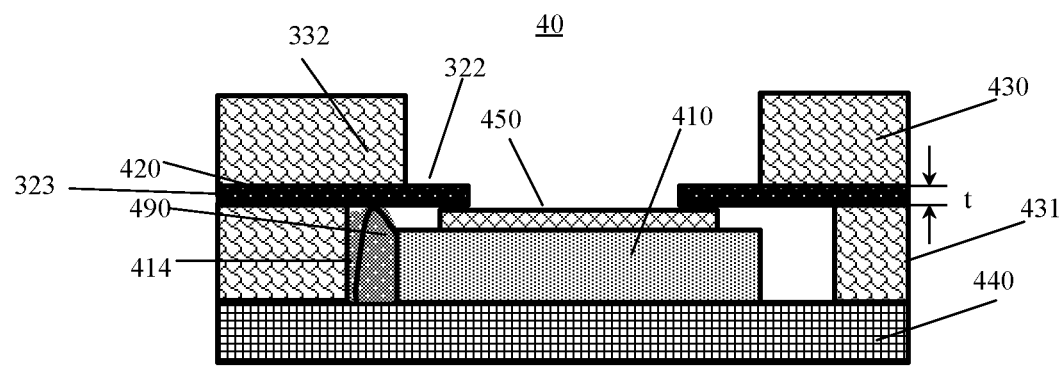
FIG. 10 is a schematic structural diagram of an optical fingerprint apparatus according to another embodiment of the present application.

In some embodiments of the present application, as shown in FIGS. 4, 6 and 10, the optical fingerprint apparatus 30 includes:

an optical fingerprint chip 310 including a sensing array having a plurality of optical sensing units, where the sensing array is configured to receive a fingerprint light signal returned from a finger above the display screen, and the fingerprint light signal is used to obtain a fingerprint image of the finger; and a light blocking layer 321 formed on an upper surface of an edge region of the optical fingerprint chip 310, where the light blocking layer 321 partially blocks the edge region of the optical fingerprint chip 310 and does not block a sensing region of the optical fingerprint chip 310, and the light blocking layer 321 is configured to block interference light entering the sensing array from the edge region of the optical fingerprint chip 310.

It should be understood that in the embodiments of the present application, the sensing region includes a region where the sensing array is located, and a region of the optical fingerprint chip 310 where no sensing array is provided may be referred to as a non-sensing region. The sensing region is generally a middle region of the optical fingerprint chip, and the non-sensing region is usually an edge region of the optical fingerprint chip.

The edge region of the optical fingerprint chip 310 in the embodiments of the present application may include part or all of a non-sensing region of the optical fingerprint chip 310.

It should be understood that in the embodiments of the present application, the light blocking layer 321 is a hollow structure, and an opening in the middle of the light blocking layer 321 is configured to expose the sensing array so that a useful light signal returned from the finger above the display screen enters the sensing array.

The embodiments of the present application do not limit the shape of the light blocking layer 321. For example, the light blocking layer 321 may be rectangular with an opening in the middle, and the shape of the opening may also be rectangular, or determined according to the shape of the sensing array.

Figure 5:
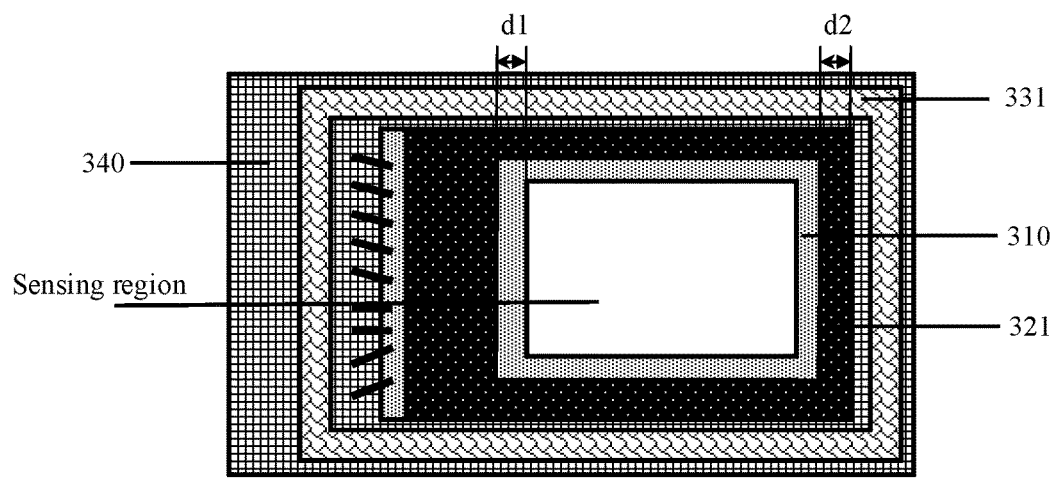
FIG. 5 is a top view of the optical fingerprint apparatus shown in FIG. 4.
Figure 7:
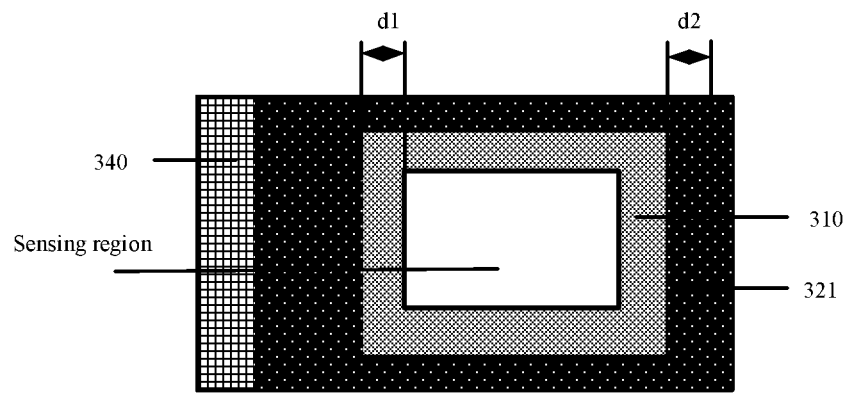
FIG. 7 is a top view of the optical fingerprint apparatus shown in FIG. 6.

In some embodiments of the present application, a distance d1 between an inner side of the light blocking layer and an outer side of the sensing array may be set to be greater than or equal to a certain threshold, for example, 200 microns (um), so as to prevent the light blocking layer 321 from blocking a useful light signal for fingerprint imaging, as shown in FIGS. 5 and 7.

In some embodiments of the present application, a width d2 of an overlapping portion of projection of the light blocking layer 321 and the edge region of the optical fingerprint chip 310 in a vertical direction is greater than or equal to a certain threshold, for example, 200 microns, so as to prevent stray light (or referred to as interference light) from the edge region of the optical fingerprint apparatus from entering the sensing array and affecting fingerprint identification, as shown in FIGS. 5 and 7.

In some embodiments of the present application, the optical fingerprint apparatus further includes a circuit board 340 for transmitting a signal (such as the fingerprint detecting signal described above), for example, a flexible printed circuit (FPC), which is disposed under the optical fingerprint chip 310, as shown in FIGS. 4 to 8. The optical fingerprint chip 310 may be connected to the circuit board 340 through a gold wire 314, and achieve electrical interconnection and signal transmission with other peripheral circuits or other elements of the electronic device as shown in FIG. 1A or FIG. 1B through the circuit board 340. For example, the optical fingerprint chip 310 may receive a control signal of a processing unit of the electronic device through the circuit board 340, and may also output a fingerprint detecting signal (for example, a fingerprint image) to the processing unit, a control unit or the like of the electronic device through the circuit board 340.

In some embodiments of the present application, as shown in FIGS. 4, 6, and 10, between the circuit board 340 and the display screen, a first foam structure 330 and a second foam structure 331 are provided at outer sides of the optical fingerprint chip, where the first foam structure 330 is disposed above the second foam structure 331.

In the embodiments of the present application, the first foam structure 330 and the second foam structure 331 are disposed at the outer side of the optical fingerprint chip 310, and may also play a role in blocking stray light to a certain extent. Optionally, the first foam structure 330 and the second foam structure 331 may further include a heat dissipation layer for heat dissipation of a light-emitting unit in the display screen and a buffer layer for buffering damage to the display screen when the electronic device is subject to a squeeze or an impact.

In some embodiments of the present application, the first foam structure and the second foam structure may include foam, and optionally, the second foam structure 331 may further include a PET material, so as to play a certain supporting role for the first foam structure 330 and the display screen.

In other embodiments of the present application, the first foam structure may include foam, and the second foam structure 331 may include a PET material, so as to play a certain supporting role for the first foam structure 330 and the display screen.

In some embodiments of the present application, both the first foam structure 330 and the second foam structure 331 are hollow structures, and openings in the first foam structure 330 and the second foam structure 331 are configured to pass a useful light signal for fingerprint identification.

In some embodiments, a width of the first foam structure may be set to be greater than a width of the second foam structure so as to form a blocking portion 332 at one end of the first foam structure 330, and the blocking portion 332 may partially block the edge region of the optical fingerprint chip and does not block the sensing region of the optical fingerprint chip, or may only block the region of the gold wire 314, so as to play a role in further blocking stray light from the edge region of the optical fingerprint chip 310.

In some embodiments of the present application, an upper surface of the second foam structure 331 is not lower than an upper surface of the light blocking layer 321.

Optionally, as shown in FIG. 4, both two end portions of the light blocking layer are formed on the upper surface of the edge region of the optical fingerprint chip. In other words, the light blocking layer is only formed on the upper surface of the edge region of the optical fingerprint chip.

Optionally, as shown in FIG. 6, not only the light blocking layer coats the upper surface of the edge region of the optical fingerprint chip, but also coats a side surface of the optical fingerprint and a region on the circuit board that is not covered by the optical fingerprint chip, and the gold wire.

Optionally, as shown in FIG. 10, one end portion 322 of the light blocking layer blocks the edge region of the optical fingerprint chip, and the other end portion 323 of the light blocking layer is arranged between the first foam structure and the second foam structure.

Optionally, in an embodiment of the present application, an arc height or package height of the gold wire 314 for connecting the circuit board 340 and the optical fingerprint chip 310 may be designed to be lower than or parallel to an upper surface of the second foam structure 331 so as to prevent the blocking portion at one end of the first foam structure 330 from damaging the gold wire 314.

Optionally, in an embodiment of the present application, the gold wire 314 is coated with a protective layer 390 to play a role of insulation and fixation.

Optionally, in some embodiments of the present application, the light blocking layer 321 may coat a region on the circuit board 340 that is not covered by the optical fingerprint chip 310, and the gold wire 314, thereby playing a role of insulation protection, as shown in FIG. 6.

It should be noted that in the embodiments of the present application, unless otherwise specified, various structural members may be fixed by glue, for example, the optical fingerprint chip 310 may be fixed to an upper surface of the circuit board 340 by double-sided tape, and the first foam structure 330 may be fixed under the display screen by glue, or the like.

In the embodiments of the present application, the optical fingerprint apparatus may further include a filter layer 350, and the filter layer 350 covers at least the sensing region, and is configured to filter out interference light that enters the sensing array and affects fingerprint imaging. It should be understood that FIGS. 4 and 6 merely take a case that the filter layer 350 is disposed on an upper surface of the optical fingerprint chip 310 an example, but the present application is not limited thereto. For example, the filter layer 350 may be disposed inside the optical fingerprint chip.

In some embodiments of the present application, the light blocking layer 321 coats an edge region of the filter layer 350 to avoid the formation of a gap between the light blocking layer 321 and the filter layer 350, and the gap results in that stray light enters the sensing array and affects fingerprint imaging.

In some embodiments, the filter layer 350 may be prepared on the upper surface of the optical fingerprint chip 310 through an evaporation or sputtering process, so that the optical fingerprint chip 310 can be used as a support structure for the filter layer 350, which can save a glass substrate with a greater thickness, and is beneficial to reducing the thickness of the optical fingerprint apparatus.

Optionally, in some embodiments of the present application, the filter layer 350 may include multiple stacked layers, and the number of layers of the stacked structure of the filter layer is not specifically limited in the embodiments of the present application.

In some embodiments, the multiple stacked layers are between 10 and 200 layers in number.

In some embodiments, the multiple stacked layers include an oxide layer of silicon and an oxide layer of titanium.

Optionally, in an embodiment of the present application, reflectance of a light entrance surface of the filter layer 350 is lower than a first threshold, for example, 1%, so as to ensure that sufficient light signals are incident on the optical fingerprint chip 310, which can thus improve fingerprint identification rate. For example, the light entrance surface of the filter layer may be subject to optical inorganic coating treatment, or coated with an organic blackened layer to reduce the reflectance of the light entrance surface of the filter layer.

The filter layer 350 is configured to reduce undesired background light in fingerprint sensing to improve optical sensing of received light by the optical fingerprint chip 310. The filter layer 350 may be specifically configured to reject an environment light wavelength, such as near infrared light and part of red light. For example, human fingers absorb most of the energy of light in wavelengths under ~580 nm, and if the filter layer is designed to reject light in wavelengths from 580 nm to infrared, undesired contributions to optical fingerprint detection in fingerprint sensing from the environment light may be greatly reduced.

It should be understood that in the embodiments of the present application, that the light blocking layer 321 is formed on the upper surface of the edge region of the optical fingerprint chip 310 means that the light blocking layer 321 and the edge region of the optical fingerprint chip 310 are in direct contact, that is, the light blocking layer 321 may use the optical fingerprint chip 310 as a supporting structure, and no additional supporting structure is required, so that the thickness of the optical fingerprint apparatus can be reduced.

In an implementation manner, the light blocking layer 321 may be directly prepared on the upper surface of the edge region of the optical fingerprint chip. In other implementation manners, the light blocking layer 321 may also be prepared first, and further the light blocking layer 321 may be pasted onto the upper surface of the edge region of the optical fingerprint chip 310.

Since the light blocking layer 321 can be formed directly on the upper surface of the optical fingerprint chip, the thickness of the light blocking layer 321 can be made relatively thin. As an example, the thickness t of the light blocking layer is less than or equal to 20 microns. Therefore, the light blocking layer may also be referred to as a light blocking film, or a light blocking film layer.

As an embodiment, the light blocking layer 321 may be prepared on the upper surface of the edge region of the optical fingerprint chip 310 through a screen printing process, and reference may be made to FIGS. 4 and 5. FIG. 5 is a top view of the structure shown in FIG. 4. It should be understood that in order to facilitate the description of a positional relationship between an optical fingerprint chip and a light blocking layer, a filter layer above an optical fingerprint chip and a first foam structure are omitted in FIG. 5.

Figure 8:
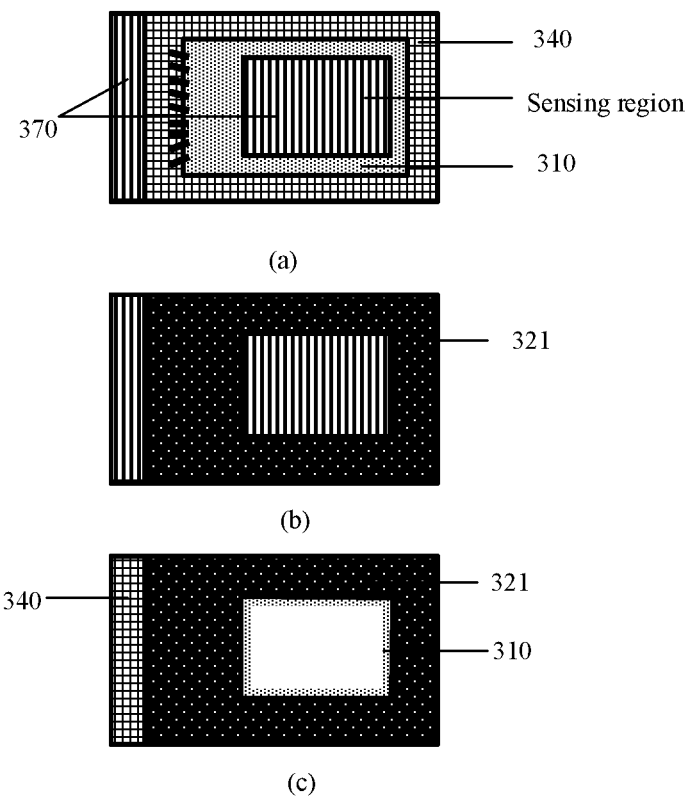
FIG. 8 is a schematic diagram of preparing an optical fingerprint apparatus according to an embodiment of the present application.

As another embodiment, the light blocking layer 321 may be prepared on the upper surface of the edge region of the optical fingerprint chip 310 through a spray coating process, and reference may be made to FIGS. 6 to 8. FIG. 7 is a top view of the structure shown in FIG. 6. It should be understood that in order to facilitate the description of a positional relationship between an optical fingerprint chip and a light blocking layer, a filter layer above an optical fingerprint chip and a first foam structure are omitted in FIG. 7 as well.

With reference to FIG. 8, a preparation process of the structure shown in FIG. 7 is described. Firstly, as shown in FIG. 8(a), a protective layer 370 is formed in an electrical connection region of a circuit board and a sensing region of an optical fingerprint chip so as to prevent these regions from being covered by a subsequent prepared light blocking layer.

Secondly, as shown in FIG. 8(b), a light blocking layer, such as oil ink, is sprayed on upper surfaces of the circuit board and the optical fingerprint chip.

Finally, as shown in FIG. 8(c), the protective layer 370 is removed to obtain the structure shown in FIG. 7.

In some embodiments, the light blocking layer 321 may be oil ink, or may be other light blocking materials.

Optionally, in an embodiment of the present application, the optical fingerprint apparatus 30 may further include an optical component configured to direct the light signal returned from the finger above the display screen to the optical fingerprint chip for optical fingerprint detection.

It should be understood that the optical component may be implemented by using any light path directing structure in the embodiment shown in FIG. 1B. For specific description, reference may be made to the description of the embodiment shown in FIG. 1B, and details are not described herein again for brevity.

As an embodiment, the optical component includes: a micro-lens array formed by a plurality of micro-lenses and at least one light shielding layer, the at least one light shielding layer is located under the micro-lens array, each light shielding layer is provided with a plurality of light passing holes, and the sensing array is configured to receive a light signal converged to the plurality of light passing holes via the micro-lens array and passing through the plurality of light passing holes.

For specific implementation, reference may be made to related description of the light path design of the micro-lens layer in the embodiment shown in FIG. 1B, and details are not described herein again for brevity.

Optionally, in an embodiment of the present application, the optical fingerprint apparatus 30 may further include an image processor, for example, a micro processing unit (MCU), and the image processor is configured to receive a fingerprint detecting signal (for example, a fingerprint image) sent from the circuit board 340 and perform fingerprint identification based on the fingerprint detecting signal.

Hereinafter, an optical fingerprint apparatus 40 according to another embodiment of the present application will be described in detail with reference to FIGS. 10 to 11. The optical fingerprint apparatus 40 is configured to be disposed under a display screen of an electronic device.

Similar to the previous embodiment, the optical fingerprint apparatus 40 may also be disposed in a slot of a middle frame of the electronic device, and the middle frame is connected under the display screen of the electronic device through foam to implement under-screen optical fingerprint detection.

In some embodiments of the present application, as shown in FIG. 10, the optical identification apparatus 40 includes:

an optical fingerprint chip 410 including a sensing array having a plurality of optical sensing units, where the sensing array is configured to receive a fingerprint light signal returned from a finger above the display screen, and the fingerprint light signal is used to obtain a fingerprint image of the finger; and a light blocking layer 420 disposed above an edge region of the optical fingerprint chip 410, and fixed between a first foam structure 430 and a second foam structure 431 under the display screen, where the first foam structure 430 and the second foam structure are located at outer sides of the edge region of the optical fingerprint chip 410, the first foam structure 430 is located above the second foam structure 431, and an upper surface of the second foam structure 431 is not lower than an upper surface of the optical fingerprint chip 410, where the light blocking layer 420 partially blocks the edge region of the optical fingerprint chip 410 and does not block a sensing region of the optical fingerprint chip, and the light blocking layer 420 is configured to block interference light entering the sensing array from the edge region of the optical fingerprint chip 410, and the sensing region is a region where the sensing array is located.

It should be understood that the optical fingerprint chip 410, the first foam structure 430, and the second foam structure 431 in the embodiment respectively correspond to the optical fingerprint chip 310, the first foam structure 330, and the second foam structure 331 in the previous embodiment. For related description, reference may be made to the description of the previous embodiment, and details are not described herein again for brevity.

It should be understood that in the embodiment of the present application, the light blocking layer is a hollow structure, and an opening in the middle of the light blocking layer is configured to expose the sensing array so that a useful light signal returned from the finger above the display screen can enter the sensing array.

The embodiment of the present application does not limit the shape of the light blocking layer. For example, the light blocking layer may be rectangular with an opening in the middle, and the shape of the opening may also be rectangular, or determined according to the shape of the sensing array.

Figure 11:
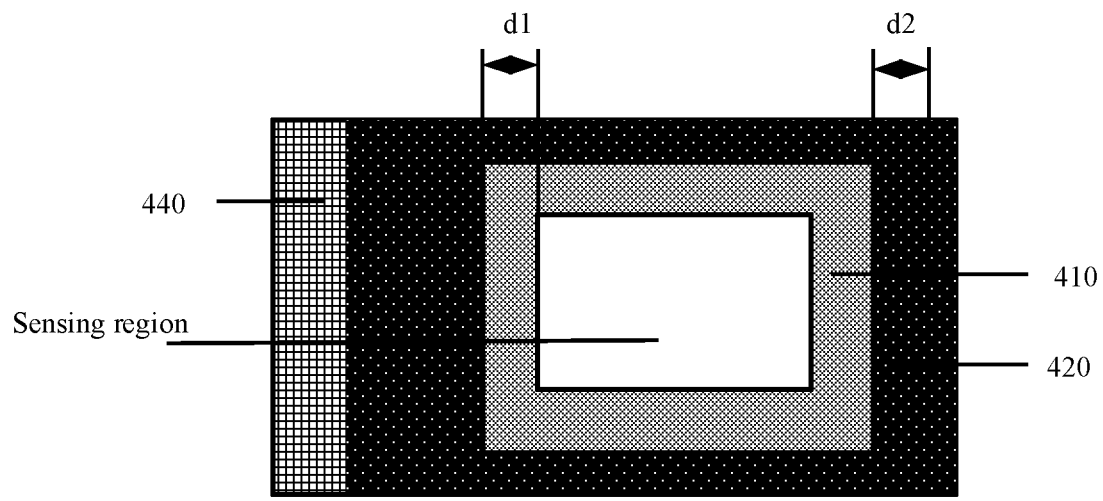
FIG. 11 is a top view of the optical fingerprint apparatus shown in FIG. 10.

In some embodiments of the present application, a distance d1 between an inner side of the light blocking layer and an outer side of the sensing array may be set to be greater than or equal to a certain threshold, for example, 200 microns (um), so as to prevent the light blocking layer 420 from blocking a useful light signal for fingerprint imaging, as shown in FIG. 11.

In some embodiments of the present application, a width d2 of an overlapping portion of projection of the light blocking layer 420 and the edge region of the optical fingerprint chip 410 in a vertical direction is greater than or equal to a certain threshold, for example, 200 microns, so as to prevent stray light (or referred to as interference light) in the edge region of the optical fingerprint apparatus from entering the sensing array and affecting fingerprint identification, as shown in FIG. 11.

In some embodiments of the present application, the optical fingerprint apparatus further includes a circuit board 440 for transmitting a signal (such as the fingerprint detecting signal described above), which corresponds to the circuit board 340 in the foregoing embodiment. For related description, reference may be made to the description of the foregoing embodiment, and details are not described herein again for brevity.

Optionally, in an embodiment of the present application, the circuit board 440 and the optical fingerprint chip 410 are connected through a gold wire 414, and an arc height or package height of the gold wire 414 may be designed to be lower than or parallel to the upper surface of the second foam structure 431 so as to prevent the light blocking layer from damaging the gold wire 414.

Optionally, in an embodiment of the present application, the gold wire 414 is coated with a protective layer 490 to play a role of insulation and fixation.

It should be noted that in the embodiment of the present application, unless otherwise specified, various structural members may be fixed by glue, for example, the optical fingerprint chip 410 may be fixed to an upper surface of the circuit board 440 by double-sided tape, and the first foam structure 430 may be fixed under the display screen by glue, or the like.

In the embodiment of the present application, the optical fingerprint apparatus may further include a filter layer 450, which may correspond to the filter layer 350 in the foregoing embodiment. For related description, reference may be made to the description in the foregoing embodiment, and details are not described herein again.

In this embodiment, an upper surface of the filter layer 450 is not higher than a lower surface of the light blocking layer 420. As an embodiment, an upper surface of the filter layer 450 is flush with a lower surface of the light blocking layer 420, so as to form a sealed space between the filter layer 450, the light blocking layer 420, the optical fingerprint chip 410 and the second foam structure 431, thereby preventing stray light from the edge region of the optical fingerprint chip from entering the sensing array.

In this embodiment, a thickness of the light blocking layer 420 may be between 20 microns and 50 microns.

In some embodiments, the light blocking layer 420 may be made of a light blocking material with a certain strength, for example, a PET material.

Optionally, in an embodiment of the present application, the optical fingerprint apparatus 40 may further include an optical component configured to direct the light signal returned from the finger above the display screen to the optical fingerprint chip for optical fingerprint detection.

It should be understood that the optical component may be implemented by using any light path directing structure in the embodiment shown in FIG. 1B. For specific description, reference may be made to the description of the embodiment shown in FIG. 1B, and details are not described herein again for brevity.

As an embodiment, the optical component includes: a micro-lens array formed by a plurality of micro-lenses and at least one light shielding layer, the at least one light shielding layer is located under the micro-lens array, each light shielding layer is provided with a plurality of light passing holes, and the sensing array is configured to receive a light signal converged to the plurality of light passing holes via the micro-lens array and passing through the plurality of light passing holes.

For specific implementation, reference may be made to related description of the light path design of the micro-lens layer in the embodiment shown in FIG. 1B, and details are not described herein again for brevity.

Optionally, in an embodiment of the present application, the optical fingerprint apparatus 40 may further include an image processor, for example, an MCU, and the image processor is configured to receive a fingerprint detecting signal (for example, a fingerprint image) sent from the circuit board 440 and perform fingerprint identification based on the fingerprint detecting signal.

Figure 12:
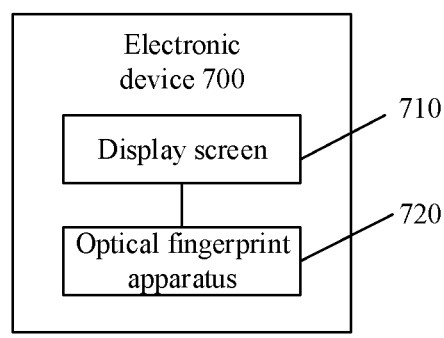
FIG. 12 is a schematic block diagram of an electronic device according to an embodiment of the present application.

An embodiment of the present application further provides an electronic device. As shown in FIG. 12, the electronic device 700 may include a display screen 710 and an optical fingerprint apparatus 720, where the optical fingerprint apparatus 720 is disposed under the display screen 710. The optical fingerprint apparatus 720 may be the optical fingerprint apparatus 30 or the optical fingerprint apparatus 40 in the forgoing embodiments. For detailed implementation, reference may be made to the related description in the foregoing embodiments, and details are not described herein again.

It should be understood that the display screen 710 may correspond to the display screen 120 in the embodiment shown in FIG. 1B. For related description, reference may be made to the foregoing description about the display screen 120, and details are not described herein again for brevity.

In some embodiments, the display screen 710 may be any display screen described above.

As an embodiment, the display screen 710 may be specifically a self-light-emitting display screen (such as an OLED display screen), and includes a plurality of self-light-emitting display units (such as OLED pixels or OLED light sources). A part of the self-light-emitting display units in the display screen can be used as an excitation light source of the optical fingerprint apparatus for optical fingerprint detection, so as to emit a light signal to a fingerprint detecting region on the display screen for optical fingerprint detection.

It should be noted that in the embodiment of the present application, the electronic device may further include a middle frame, which is a frame provided between the display screen and a battery of the electronic device to carry various components therein, and the various components therein include but are not limited to a mainboard, a camera, a flex cable, various sensors, a microphone, an earphone, or the like.

Optionally, in some embodiments, a slot is provided on an upper surface of the middle frame, and the optical fingerprint apparatus is disposed in the slot, and the optical fingerprint apparatus is fixed under the display screen through the middle frame to implement under-screen optical fingerprint detection.

Optionally, the middle frame may be made of a metal or alloy material, or may also be made of a plastic material, which is not limited in the embodiment of the present application.

It should be noted that specific examples in embodiments of the present application are just for helping those skilled in the art better understand the embodiments of the present application, rather than for limiting the scope of the embodiments of the present application.

It should be understood that terms used in embodiments of the present application and the claims appended hereto are merely for the purpose of describing particular embodiments, and are not intended to limit the embodiments of the present application. For example, the use of a singular form of "a", "the" and "said" in the embodiments of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are executed in hardware or software mode depends on a particular application and a design constraint condition of the technical solutions. Persons skilled in the art may use different methods to implement the described functions for every particular application, but it should not be considered that such implementation goes beyond the scope of the present application.

In the several embodiments provided in the present application, it should be understood that the disclosed system and apparatus may be implemented in other manners. For example, the foregoing described apparatus embodiments are merely exemplary. For example, division of the units is merely logical function division and there may be other division manners in practical implementation. For example, multiple units or components may be combined or integrated into another system, or some features may be ignored or not executed. In addition, the displayed or discussed mutual coupling or direct coupling or communication connection may be indirect coupling or communication connection through some interfaces, apparatuses or units, and may also be connection in an electrical, mechanical, or other forms.

The units described as separate parts may or may not be physically separate, and parts displayed as units may or may not be physical units, may be located in one position, or may be distributed on multiple network units. Part of or all of the units here may be selected according to a practical need to achieve the objectives of the solutions of the embodiments of the present application.

In addition, functional units in the embodiments of the present application may be integrated into a processing unit, or each unit may exist alone physically, or two or more units may be integrated into one unit. The integrated unit may be implemented in a form of hardware, or may be implemented in a form of a software functional unit.

If implemented in the form of a software functional unit and sold or used as a separate product, the integrated unit may be stored in a computer-readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present application. The foregoing storage medium includes a variety of media capable of storing program codes, for example, a USB disk, a mobile hard disk, a read-only memory (ROM), a random access memory (RAM), a magnetic disk, an optical disk or the like.

The foregoing descriptions are merely specific implementations of the present application. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims.

What is claimed is:

1. An optical fingerprint apparatus, applied to an electronic device having a display screen, wherein the optical fingerprint apparatus is configured to be disposed under the display screen, and the optical fingerprint apparatus comprises:
   an optical fingerprint chip comprising a sensing array having a plurality of optical sensing units, wherein the sensing array is configured to receive a fingerprint light signal returned from a finger above the display screen, and the fingerprint light signal is used to obtain a fingerprint image of the finger;
   a light blocking layer formed on an upper surface of an edge region of the optical fingerprint chip, wherein the light blocking layer partially blocks the edge region of the optical fingerprint chip and does not block a sensing region of the optical fingerprint chip, and the light blocking layer is configured to block interference light entering the sensing array from the edge region of the optical fingerprint chip, wherein the sensing region is a region where the sensing array is located; and
   a filter layer disposed on an upper surface of the optical fingerprint chip, wherein the filter layer covers at least the sensing region, and the light blocking layer coats an edge region of the filter layer.

2. The optical fingerprint apparatus according to claim 1, wherein the light blocking layer is formed on the upper surface of the edge region of the optical fingerprint chip through a screen printing process or a spray coating process, and a thickness of the light blocking layer is less than or equal to 20 microns.

3. The optical fingerprint apparatus according to claim 1, wherein a distance between an inner side of the light blocking layer and an outer side of the sensing region of the optical fingerprint chip is greater than 200 microns.

4. The optical fingerprint apparatus according to claim 1, wherein a width of an overlapping portion of projection of the light blocking layer and the edge region of the optical fingerprint chip in a vertical direction is greater than or equal to 200 microns.

5. The optical fingerprint apparatus according to claim 1, wherein the optical fingerprint apparatus further comprises:
   a circuit board disposed under the optical fingerprint chip, and electrically connected to the optical fingerprint chip through a gold wire, wherein the light blocking layer coats a region on the circuit board that is not covered by the optical fingerprint chip, and the gold wire.

6. The optical fingerprint apparatus according to claim 1, wherein the optical fingerprint apparatus further comprises a circuit board disposed under the optical fingerprint chip and electrically conned to the optical fingerprint chip, a first foam structure and a second foam structure are provided at outer sides of the optical fingerprint chip and arranged between the display screen and the circuit board, a blocking portion is formed at one end of the first foam structure close to the optical fingerprint chip, and the blocking portion partially blocks the light blocking layer and does not block the sensing region of the optical fingerprint chip.

7. The optical fingerprint apparatus according to claim 6, wherein one end portion of the light blocking layer blocks the edge region of the optical fingerprint chip, and the other end portion of the light blocking layer is arranged between the first foam structure and the second foam structure.

8. The optical fingerprint apparatus according to claim 1, wherein the light blocking layer is oil ink.

9. The optical fingerprint apparatus according to claim 1, wherein optical fingerprint apparatus comprises an optical component, the optical component comprises a micro-lens array formed by a plurality of micro-lenses and at least one light shielding layer, wherein the at least one light shielding layer is located under the micro-lens array, each light shielding layer is provided with a plurality of light passing holes, and the sensing array is configured to receive a light signal converged to the plurality of light passing holes via the micro-lens array and passing through the plurality of light passing holes.

10. The optical fingerprint apparatus according to claim 1, wherein a slot is provided in a middle frame of the electronic device, and the optical fingerprint apparatus is configured to be disposed in the slot.

11. An optical fingerprint apparatus, applied to an electronic device having a display screen, wherein the optical fingerprint apparatus is configured to be disposed under the display screen, and the optical fingerprint apparatus comprises:
- an optical fingerprint chip comprising a sensing array having a plurality of optical sensing units, wherein the sensing array is configured to receive a fingerprint light signal returned from a finger above the display screen, and the fingerprint light signal is used to obtain a fingerprint image of the finger;
- a light blocking layer formed on an upper surface of an edge region of the optical fingerprint chip and configured to block interference light entering the sensing array from the edge region of the optical fingerprint chip; and
- wherein a first foam structure and a second foam structure arranged under the display screen and located at outer sides of the edge region of the optical fingerprint chip, the first foam structure located above the second foam structure, an upper surface of the second foam structure is not lower than an upper surface of the optical fingerprint chip, and a blocking portion is formed at one end of the first foam structure close to the optical fingerprint chip, and the blocking portion partially blocks the light blocking layer and does not block the sensing region of the optical fingerprint chip.

12. The optical fingerprint apparatus according to claim 11, wherein both two end portions of the light blocking layer are formed on the upper surface of the edge region of the optical fingerprint chip.

13. The optical fingerprint apparatus according to claim 11, wherein the optical fingerprint apparatus further comprises:
- a circuit board disposed under the optical fingerprint chip, and electrically connected to the optical fingerprint chip through a gold wire, wherein the light blocking layer coats a side surface of the optical fingerprint and a region on the circuit board that is not covered by the optical fingerprint chip, and the gold wire.

14. The optical fingerprint apparatus according to claim 11, wherein one end portion of the light blocking layer blocks the edge region of the optical fingerprint chip, and the other end portion of the light blocking layer is arranged between the first foam structure and the second foam structure.

15. The optical fingerprint apparatus according to claim 11, wherein a distance between an inner side of the light blocking layer and an outer side of the sensing region is greater than 200 microns.

16. The optical fingerprint apparatus according to claim 11, wherein a width of an overlapping portion of projection of the light blocking layer and the edge region of the optical fingerprint chip in a vertical direction is greater than or equal to 200 microns.

17. The optical fingerprint apparatus according to claim 11, wherein the light blocking layer is oil ink.

18. An electronic device, comprising:
a display screen; and
an optical fingerprint apparatus configured to be disposed under the display screen; wherein the optical fingerprint apparatus comprises:
- an optical fingerprint chip comprising a sensing array having a plurality of optical sensing units, wherein the sensing array is configured to receive a fingerprint light signal returned from a finger above the display screen, and the fingerprint light signal is used to obtain a fingerprint image of the finger;
- a light blocking layer formed on an upper surface of an edge region of the optical fingerprint chip, wherein the light blocking layer partially blocks the edge region of the optical fingerprint chip and does not block a sensing region of the optical fingerprint chip, and the light blocking layer is configured to block interference light entering the sensing array from the edge region of the optical fingerprint chip, wherein the sensing region is a region where the sensing array is located; and
- a filter layer disposed on an upper surface of the optical fingerprint chip, wherein the filter layer covers at least the sensing region, and the light blocking layer coats an edge region of the filter layer.

19. The electronic device according to claim 18, wherein the display screen is an organic light-emitting diode (OLED) display screen, and the display screen comprises a plurality of OLED light sources, wherein the optical fingerprint apparatus employs at least a part of the OLED light sources as an excitation light source for optical fingerprint detection.

* * * * *